(12) United States Patent
Wang

(10) Patent No.: US 8,994,388 B2
(45) Date of Patent: Mar. 31, 2015

(54) LOW-VOLTAGE TESTING DEVICE FOR HIGH-VOLTAGE FREQUENCY CONVERTER OF SERIAL SUPERPOSITION VOLTAGE TYPE

(71) Applicant: Rockwell Automation Technologies, Inc., Mayfield Heights, OH (US)

(72) Inventor: Zhuo Wang, Harbin (CN)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 181 days.

(21) Appl. No.: 13/720,394

(22) Filed: Dec. 19, 2012

(65) Prior Publication Data

US 2013/0187663 A1  Jul. 25, 2013

(30) Foreign Application Priority Data

Dec. 19, 2011  (CN) .................. 2011 2 0532650 U

(51) Int. Cl.
*G01R 31/28* (2006.01)
*G01R 31/42* (2006.01)

(52) U.S. Cl.
CPC .............. *G01R 31/28* (2013.01); *G01R 31/42* (2013.01)
USPC ........................................................ 324/713

(58) Field of Classification Search
CPC ................................. G01R 31/28; G01R 31/42
USPC ......................................................... 324/713
See application file for complete search history.

(56) References Cited

U.S. PATENT DOCUMENTS

| | | | | |
|---|---|---|---|---|
| 6,326,793 B1 * | 12/2001 | Moore | ........................ | 324/615 |
| 2005/0254273 A1 | 11/2005 | Soudier et al. | | |
| 2008/0278143 A1 * | 11/2008 | Cox et al. | ................. | 324/121 R |
| 2010/0111592 A1 * | 5/2010 | Hassell et al. | .................. | 403/24 |
| 2010/0140958 A1 * | 6/2010 | Hyde et al. | ..................... | 290/1 R |
| 2010/0327793 A1 * | 12/2010 | Komulainen et al. | ......... | 318/503 |
| 2011/0002445 A1 * | 1/2011 | Hattrup et al. | ................ | 378/101 |
| 2012/0217915 A1 * | 8/2012 | Wu et al. | .................. | 318/400.07 |

FOREIGN PATENT DOCUMENTS

| CN | 201120532650.2 | * | 8/2012 | ............. | G01R 31/00 |
|---|---|---|---|---|---|
| WO | WO2010111412 A2 | | 9/2010 | | |

OTHER PUBLICATIONS

European Search Report, corresponding EP Appl. No. 12198283.9-156-/2607912; EPSearch Report Dated Oct. 16, 2013; completed Oct. 7, 2013; Munich, Germany.

* cited by examiner

*Primary Examiner* — Jeff Natalini
(74) *Attorney, Agent, or Firm* — Fay Sharpe LLP

(57) ABSTRACT

A low-voltage testing device for a high-voltage frequency converter of a serial superposition voltage type including a tap transformer, power portion, monitoring box, analog interface board, voltage detecting portion and remote control portion, in which the tap transformer is connected to the power portion, the power portion is connected to the voltage detecting portion, the monitoring box is connected to the power portion via an optical fiber and the analog interface board is connected to the monitoring box and the remote control portion respectively.

3 Claims, 2 Drawing Sheets

LOW-VOLTAGE TESTING DEVICE FOR HIGH-VOLTAGE FREQUENCY CONVERTER OF SERIAL SUPERPOSITION VOLTAGE TYPE

This application claims priority to and the benefit of Chinese patent application number 201120532650.2, filed Dec. 19, 2011, the entirety of which application is hereby incorporated by reference.

FIELD

The present disclosure relates to frequency converter technique, and more particularly, to a low-voltage testing device for a high-voltage frequency converter of a serial superposition voltage type.

BACKGROUND

A main controller (monitoring box) of a frequency converter has a unit-combined structure, and its core is a central processing unit (CPU) unit having double CPUs communicating with an interface board and phase control boards A, B and C via a bus. An operation command, a frequency setting signal, an electric machine current and voltage, and so on may be accepted from an analog input interface. A CPU board calculates control information and status information according to the operation command, the setting signal and other input signals. The phase control boards A, B and C accept the control information from the CPU board, generate pulse width modulation (PWM) control signals and send control optical signals to a power unit via an electric-to-optical transducer. An acknowledgement signal from the power unit is converted to an electric signal in the phase control boards A, B and C, subjected to processing and then sent to the CPU board for processing. The status information may be sent out through the interface board and an interface sub-template. Debugging of the main controller is very important for the high-voltage frequency converter, however, existing debugging means is simplified, and an effect of testing can not be achieved actually under self-operating by simulating the high voltage in a case of shielding relevant status information of the power unit. It is much more troublesome with being tested under high voltage condition due to hugeness of the equipment, inconvenience of connections of high voltage wires and loads and high cost, and more problems occur when there are faults and repair is needed.

SUMMARY

The present disclosure provides a low-voltage testing device for a high-voltage frequency converter of a serial superposition voltage type.

The testing device includes a tap transformer, a power portion, a monitoring box, an analog interface board, a voltage detecting portion and a remote control portion, in which the tap transformer is connected to the power portion, the power portion is connected to the voltage detecting portion, the monitoring box is connected to the power portion via an optical fiber and the analog interface board is connected to the monitoring box and the remote control portion respectively.

The utility model further has the following technical features:

(1) The power portion is divided into three groups, each group being one phase and six power units being connected in series in each phase.

(2) The monitoring box includes a PWM unit, a FPGA, a CPLD unit, a double-DSP unit, an interface circuit and a touch screen, in which the PWM unit is connected to the FPGA and the CPLD unit, the FPGA and the CPLD unit are connected to the double-DSP unit and the double-DSP unit is connected to the interface circuit and the touch screen respectively.

(3) The remote control portion includes an automatic voltage regulation (AVR) control board and an operation panel, the AVR control board being connected to the operation panel.

The novel low-voltage testing device for the high-voltage frequency converter of the serial superposition voltage type has a simple structure and reliable performance, simulates an on-load final test and completes software test of a control system. Advantages of the testing device are that MOSFET is used as a power device instead of IGBT, the cost is low and the repair is convenient; each power board represents one unit, and thus the size is small and the operation is convenient; function tests of the system and the monitoring box can be simulated completely; and an input voltage of the system is 380V, and an output thereof is a step wave ranging from 0 to 380V, which belongs to a low voltage platform, and thus the system is safe and reliable. The test device may provide a reasonable cost-performance ratio with respect to conditions in which the existing high-voltage frequency converter has a complicated structure, and thus wiring and debugging are not convenient, and problems occurring in the monitoring equipment will cause faults of the frequency converter or damage of the power units, and so on, and the low-voltage testing platform will be a best choice at this time. It is required that the operating stability of the high-voltage frequency converter should be reliable in order to ensure production to be carried out normally and continuously in industries such as metallurgy, water supply, electric power and so on. After practical checking, the design scheme of the low-voltage testing on the high-voltage frequency converter facilitates reliable performance and long term operating, and thus has a wide application.

DETAILED DESCRIPTION

Further description will be made in conjunction with the accompanying drawings by way of example below.

Figure 1:
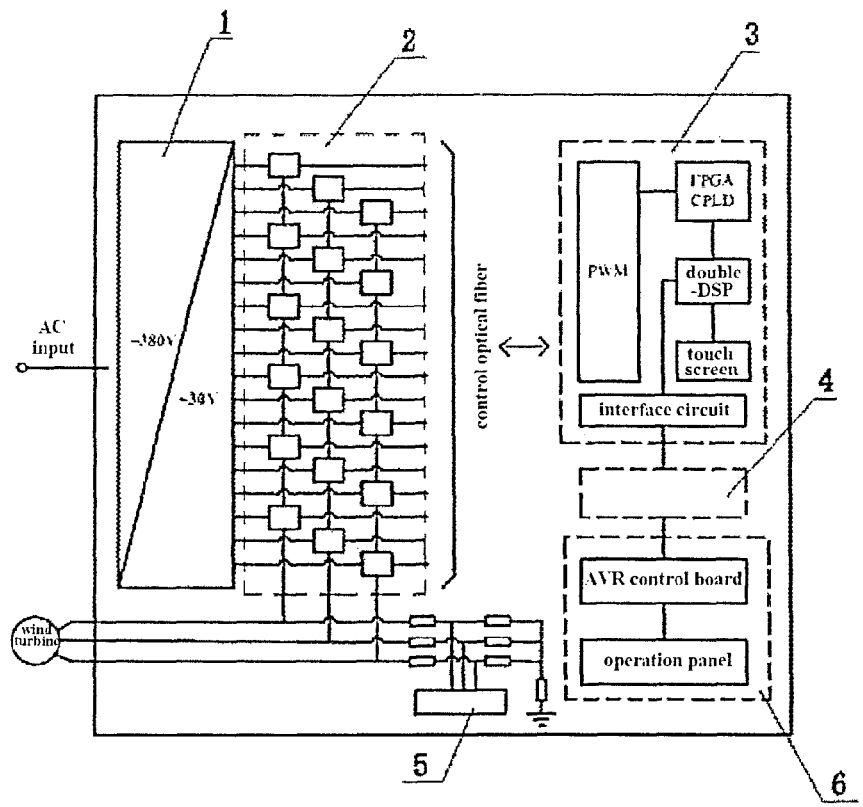
FIG. 1 is a functional block diagram of the whole system of the present disclosure.
Figure 2:
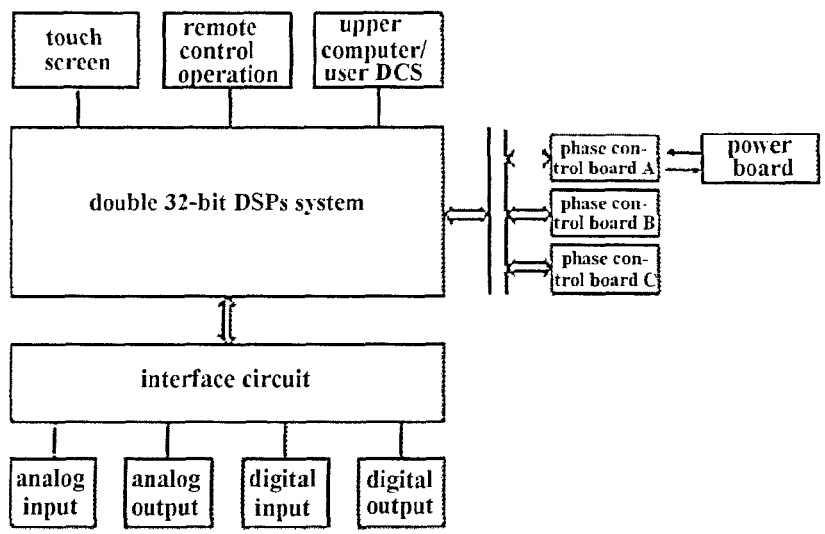
FIG. 2 is a functional block diagram of the monitoring box of the present disclosure.
Figure 3:
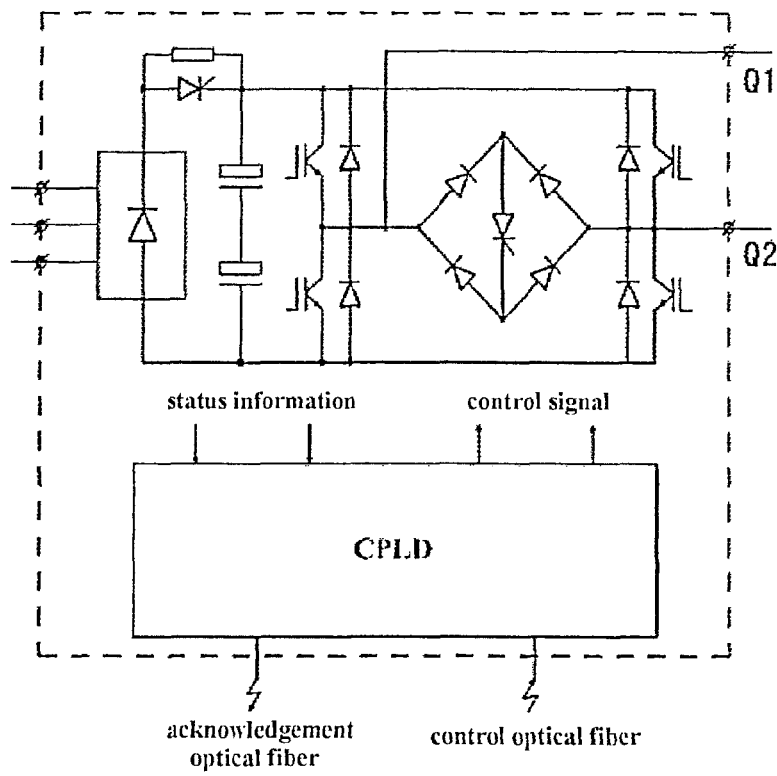
FIG. 3 is a functional block diagram of the power board of the present disclosure.
Figure 4:
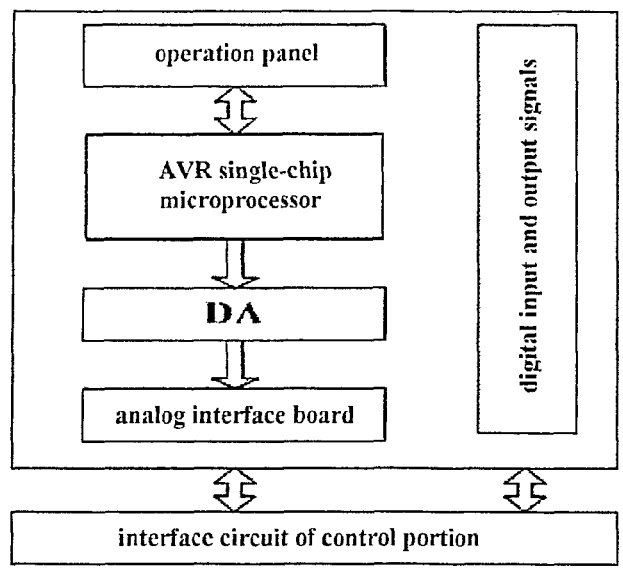
FIG. 4 is a functional block diagram of the remote control portion of the present disclosure.

Embodiment 1: with reference to FIG. 1, the low-voltage testing device for the high-voltage frequency converter of the serial superposition voltage type includes a tap transformer (1), a power portion (2), a monitoring box (3), an analog interface board (4), a voltage detecting portion (5) and a remote control portion (6), in which the tap transformer (1) is connected to the power portion (2), the power portion (2) is connected to the voltage detecting portion (5), the monitoring box (3) is connected to the power portion (2) via an optical fiber and the analog interface board (4) is connected to the monitoring box (3) and the remote control portion (6) respectively.

The power portion (2) is divided into three groups, each group being one phase and six power units being connected in series in each phase.

The monitoring box (3) includes a pulse width modulation (PWM) unit, a field-programmable gate array (FPGA), a complex programmable logic device (CPLD) unit, a double-digital signal processing (double-DSP) unit, an interface circuit and a touch screen, in which the PWM unit is connected to the FPGA and the CPLD unit, the FPGA and the CPLD unit are connected to the double-DSP unit and the double-DSP unit is connected to the interface circuit and the touch screen respectively.

The remote control portion (6) includes an AVR control board and an operation panel, the AVR control board being connected to the operation panel.

Embodiment 2: with reference to FIG. 1 to FIG. 4, the operating principles are as follows:

(1) Principles of the Whole System

The disclosure provides a low-voltage frequency converter simulating unit connection in series and multi-superposition. Three-phase input voltage of 380V is decreased via an input transformer and is phase-shifted to power the power units in a power unit cabinet. The power portion 2 is divided into three groups, each group being one phase, and an output of the power board of each phase is cascaded end to end. The remote control portion 6 performs real time rectification and inversion control and detection on each power board through the optical fiber, and the user needs to set the frequency through an operation interface. Further, the control unit sends control information to the power board for corresponding rectifying and inverting adjustment so as to output a three-phase voltage ranging from about 0 to 380V.

(2) The Monitoring Box

Connection and control between the monitoring box and each power board are implemented by using two optical fibers. The monitoring box may receive operation commands and given signals from the touch screen and the remote control portion, process them and then output voltage and frequency setting signals to three phase control units where these signals are converted into PWM control signals, which are converted into optical signals via an electric-to-optical transducer and then sent to each power unit from an optical transmitter port. Acknowledgement information from the power unit is converted into an electric signal via the optical-to-electric transducer, subject to processing and then sent to a main controller for centralized processing. The main controller performs operations such as operating control, status analysis, fault diagnosis and so on according to the control commands, the given signals, operating information and the acknowledgement information, performs fault processing according to properties of the faults after having detected the faults, such as system locking, high-voltage tripping and so on, and provides corresponding fault signals.

(3) The Power Portion

The power portion is a single-phase bridge converter which is powered by a secondary winding of an input tap transformer. The power portion is controlled by four MOSFETs using a SPWM method after rectification and inversion so as to output AC electric power with variable frequency and variable voltage. A plurality of power boards being superposed in series may output three-phase AC electric power with a frequency of 50 HZ and a line voltage of 380V so as to drive an AC motor. The CPLD detects signals such as a voltage, a current and so on and some status information to be communicably sent to the monitoring box for processing. Driving signals and control signals are communicably sent by the monitoring box and processed in a centralized way by the CPLD to drive an H-bridge circuit. Both the control signals and acknowledgement signals from/to the monitoring box are transmitted via optical cables, which may achieve high electrical isolation capability and high anti-EMI (electromagnetic interference) performance.

(4) The Remote Control Portion

The remote control portion is constituted by an AVR single-chip microprocessor as a core element, a digital to analog (DA) converter and some peripheral circuits. The operation panel sets the frequency and control signals such as start, stop and reset signals and so on to be communicably sent to the AVR single-chip microprocessor for processing, and then a 0-10V DC voltage signal is output from the DA converter and sent to the analog interface board and then to the main controller. Further, digital signals such as the high-voltage tripping, reset, emergency stop, auxiliary power source switching-on signals and so on are sent to the remote control portion, and thus the remote control equipment implements simulation of control systems such as an on-site remote control box, a DCS (distributed control system) and so on.

The invention claimed is:

1. A low-voltage testing device for a high-voltage frequency converter of a serial superposition voltage type, comprising:
   a tap transformer;
   a power portion connected to the tap transformer, the power portion being divided into three groups, the individual groups comprising a plurality of power boards superposed in series;
   a monitoring box connected to the power portion via an optical fiber and comprising a main controller of the high-voltage frequency converter;
   an analog interface board connected to the monitoring box;
   a voltage detecting portion connected to the power portion; and
   a remote control portion connected to the analog interface board and comprising:
      an automatic voltage regulation (AVR) control board,
      an operation panel connected to the AVR control board, wherein the operation panel provides frequency and control signals based on user input, and
      a digital to analog converter receiving a user set frequency value from the operation panel and provides an analog signal to the main controller through the analog interface board for testing the high-voltage frequency converter;
   wherein the monitoring box receives operation commands including the analog signal, control commands and digital signals from the remote control portion and provides pulse width modulation (PWM) control signals to the power boards according to the operation commands and the analog signal to perform real time rectification and inversion control and detection on each power board through the optical fiber, operating control, status analysis and fault diagnosis at least partially according to the analog signal, control commands and digital signals from the remote control portion for test operation of one or more of the power boards;
   wherein the monitoring box provides fault signals to the remote control portion based on the status analysis and fault diagnosis; and
   wherein the remote control portion receives the fault signals from the monitoring box to perform low-voltage testing by providing the frequency and control signals to simulate on-load final test and software test.

2. The low-voltage testing device for the high-voltage frequency converter of the serial superposition voltage type according to claim 1, wherein each group of the power portion is one phase and six power units are connected in series in each phase.

3. The low-voltage testing device for the high-voltage frequency converter of the serial superposition voltage type according to claim 1, wherein the monitoring box comprises:
- a pulse width modulation (PWM) unit;
- a field-programmable gate array (FPGA);
- a complex programmable logic device (CPLD) unit;
- a double-digital signal processing (double-DSP) unit;
- an interface circuit; and
- a touch screen;
- wherein the PWM unit is connected to the FPGA and the CPLD unit;
- wherein the FPGA and the CPLD unit are connected to the double-DSP unit; and
- wherein the double-DSP unit is connected to the interface circuit and the touch screen respectively.

* * * * *